United States Patent
Wojciechowski et al.

(10) Patent No.: US 9,270,281 B1
(45) Date of Patent: Feb. 23, 2016

(54) APPARATUSES AND METHODS FOR TUNING CENTER FREQUENCIES

(71) Applicant: Sandia Corporation, Albuquerque, NM (US)

(72) Inventors: Kenneth Wojciechowski, Albuquerque, NM (US); Roy H. Olsson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/051,818

(22) Filed: Oct. 11, 2013

(51) Int. Cl.
*H03L 7/00* (2006.01)

(52) U.S. Cl.
CPC .................................. *H03L 7/00* (2013.01)

(58) Field of Classification Search
CPC ........................................................ H01L 41/047
USPC ................................ 331/34, 107 A, 154, 155
See application file for complete search history.

(56) References Cited

U.S. PATENT DOCUMENTS

| | | | | |
|---|---|---|---|---|
| 3,921,093 | A * | 11/1975 | Lewis | 331/1 A |
| 4,401,956 | A * | 8/1983 | Joshi | 333/152 |
| 5,874,866 | A * | 2/1999 | Satoh et al. | 331/107 A |
| 6,794,948 | B2 * | 9/2004 | Kobayashi et al. | 331/154 |
| 6,943,484 | B2 | 9/2005 | Clark et al. | |
| 2010/0181868 | A1 * | 7/2010 | Gaidarzhy et al. | 310/313 B |
| 2010/0315170 | A1 * | 12/2010 | Locascio et al. | 331/15 |

OTHER PUBLICATIONS

Kim, et al., "A1N Microresonator-Based Filters with Multiple Bandwidths at Low Intermediate Frequencies", Journal of Microelectromechanical Systems vol. 22, No. 4, Aug. 13, 949-961.
Kim, et al., "Capacitive Frequency Tuning of ALN Micromechanical Resonators" Sandia National Laboratories, 2011, 1-4.
Vittoz et al., "High-performance crystal oscillator circuits: theory and applications", IEEE Journal of Solid-State Circuits; vol. 23, No. 3, 1988, 774-783; Figure 5.
Wojciechowski, et al., "Single-chip precision oscillators based on multi-frequency, high-Q aluminum nitride MEMS resonators", Solid-State Sensors, Actuators and Microsystems Conference, 2009, 2126-2130.

* cited by examiner

*Primary Examiner* — Joseph Chang
*Assistant Examiner* — Jeffrey Shin
(74) *Attorney, Agent, or Firm* — Martin I. Finston

(57) ABSTRACT

Apparatuses and methods for tuning center frequencies are described herein. Examples of tuning described herein including tuning using feedback from the resonator. Variable gain feedback for tuning of acoustic wave resonators is provided in some examples. An example apparatus may include a resonator and a feedback loop. The resonator may be configured to receive a tuning signal and to provide a feedback signal. The feedback signal may be based on the tuning signal. The feedback loop may be configured to receive the feedback signal from the resonator. The feedback loop further may be configured to provide the tuning signal to actively tune a center frequency of the resonator. The tuning signal may be based on the feedback signal.

13 Claims, 5 Drawing Sheets

APPARATUSES AND METHODS FOR TUNING CENTER FREQUENCIES

STATEMENT REGARDING RESEARCH & DEVELOPMENT

This invention was developed under Contract DE-AC04-94AL85000 between Sandia Corporation and the U.S. Department of Energy. The U.S. Government has certain rights in the invention.

TECHNICAL FIELD

Embodiments of the invention relate generally to resonators and in particular, to tuning resonator center frequencies.

BACKGROUND

Acoustic resonators may rely on resonance of materials, such as piezoelectric materials, to provide electrical signals, and as a result resonators may be able to provide signals with stable frequencies and predicable temperature characteristics. Accordingly, resonators are regularly used to implement electrical frequency control applications, such as clock signal generation in digital circuits, frequency stabilization in wireless devices, and signal filtering. Typically, resonators are configured to resonate at a frequency known as a center frequency. The center frequency of a resonator is predominantly determined based on factors such as the physical dimensions of the resonator and materials used to make it. Manufacturing variations in the thickness and other dimensions of the material used to make the resonator often result in poor center frequency accuracy, however.

In order to compensate for these errors, center frequencies may be passively tuned by coupling resonators to reactive circuit components, such as capacitors and inductors. In this manner, center frequencies may be increased or decreased such that a desired center frequency is achieved. Tuning center frequencies in this manner, however, can lead to increases in motional impedance of the resonator and/or degradation in overall performance. For example, tuning center frequencies may accelerate the rate at which center frequencies drift over time. Moreover, passively tuning center frequencies may provide a limited range over which tuning center frequencies may be tuned.

DETAILED DESCRIPTION

Apparatuses and methods for tuning center frequencies are disclosed herein. As will be described, in accordance with one or more embodiments, center frequencies may be actively tuned. Examples of active tuning described herein including tuning using feedback from the resonator. Variable gain feedback for tuning of acoustic wave resonators is provided in some examples. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention. Also, relative and directional references (e.g., above, below, over, etc.) are given by way of example to aid the reader's understanding of the particular embodiments described herein, and should not be read as requirements or limitations except as specifically set forth in the claims. As described herein, directional references illustrating a directional relationship of two or more components do not exclude the inclusion of additional components adjacent, between, and/or proximate the two or more components unless specifically stated (e.g., directly above).

Figure 1:
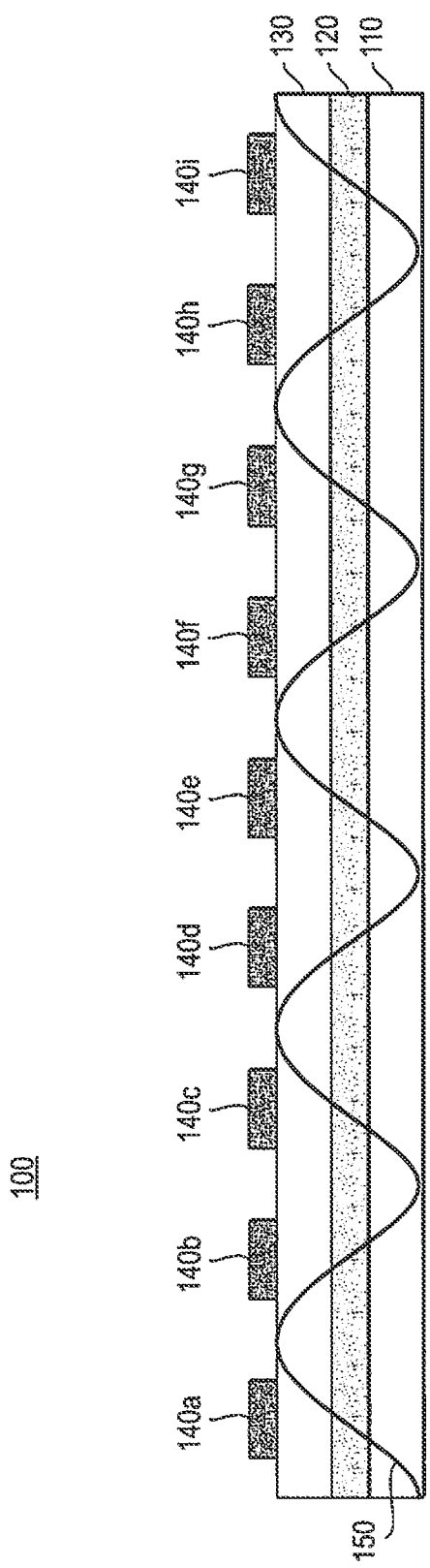
FIG. 1 is a cross-section diagram of a resonator according to an embodiment of the present invention.

FIG. 1 is a cross-section diagram of a resonator 100 according to an embodiment of the present invention. The resonator 100 may include a substrate 110, a lower electrode 120, a piezoelectric film 130, and upper electrodes 140. The substrate 110 may be any substrate known in the art, now or in the future, and may be configured such that one or more layers may be formed over the substrate 110. The substrate 110 may be an oxide compound (e.g., $SiO_2$) and/or may be one or more other compounds. The lower electrode 120 may be formed over the substrate 110 and may be a conductive material, such as aluminum or copper. In at least one embodiment, the lower electrode 120 may be grounded. The piezoelectric film 130 may be formed over the lower electrode 120 and may include one or more piezoelectric materials, including but not limited to, crystal piezoelectric materials, ceramic piezoelectric materials, and/or biological piezoelectric materials. The piezoelectric film 130 may, for instance, include aluminum nitride (AlN). The upper electrodes 140 may be formed over the piezoelectric material 130 and may be a conductive material.

In operation, an input signal may be applied to one or more of the upper electrodes 140. As a result, stress (e.g., lateral stress) may be induced in the resonator. Waves resulting from the lateral stress may propagate through the piezoelectric film 130 to other upper electrodes 140 where the induced stress may be transduced to an output signal. The distribution 150, for example, illustrates an example displacement distribution of the resonator 100. The slope of the distribution 150 located under each upper electrode 140 is indicative of the polarity of the charge on the electrode.

In some instances, a center frequency, or resonant frequency, of the resonator 100 may be determined. A center frequency of the resonator 100 may, for example, be determined in accordance with following equation:

$$f_r = \frac{C_m}{\lambda},$$

where $f_r$ corresponds to the center frequency, lambda ($\lambda$) corresponds to the wavelength of the mode of oscillation and $C_m$ corresponds to the material speed of the piezoelectric film 130. The closer a frequency of the input signal is to the center frequency of the resonator 100, the greater the lateral stress that is induced in the piezoelectric film 130, and as a result, the greater the magnitude of the output signal.

The center frequency of the resonator 100 further may be tuned (e.g., adjusted). The center frequency of the resonator 100 may be tuned, for instance, by coupling (e.g., terminating) one or more of the upper electrodes 140 with a reactive load. By way of example, decreasing the magnitude of capacitance coupled to one or more upper electrodes 140 may increase the center frequency whereas increasing the magnitude of capacitance coupled to one or more upper electrodes 140 may decrease the center frequency. Providing an infinite capacitance to an upper electrode, for instance, results in tuning the center frequency to the minimum achievable center frequency, or natural center frequency, of the resonator.

Capacitances between each upper electrode 140 and the lower electrode 120, or shunt capacitances, however, may limit the range over which a center frequency may be tuned. For example, the available tuning range may be inversely related to the shunt capacitance of resonator 100. Hence, the inherent capacitance of the resonator may limit the minimum achievable capacitance between each upper electrode and the lower electrode, and as a result may limit the tuning range achievable by adding further capacitive or other loads to the upper electrodes.

Whereas the resonator 100 has been represented in FIG. 1 for purposes of illustration as a harmonic overtone resonator, it will be appreciated by those having ordinary skill in the art that other resonators may be used in accordance with examples described herein, including but not limited to, film bulk acoustic wave resonators, surface acoustic wave resonators, electrostatically driven devices, crystal resonators, and/or any other resonators known in the art now or in the future. Moreover, whereas the resonator 100 is shown as including 9 upper electrodes 140, it will be appreciated that the resonator 100 may include any number of upper electrodes 140. Varying the number of upper electrodes 140 may, for instance, allow for a tradeoff between the range at which a center frequency may be tuned and various impedances of the resonator 100.

Figure 2:
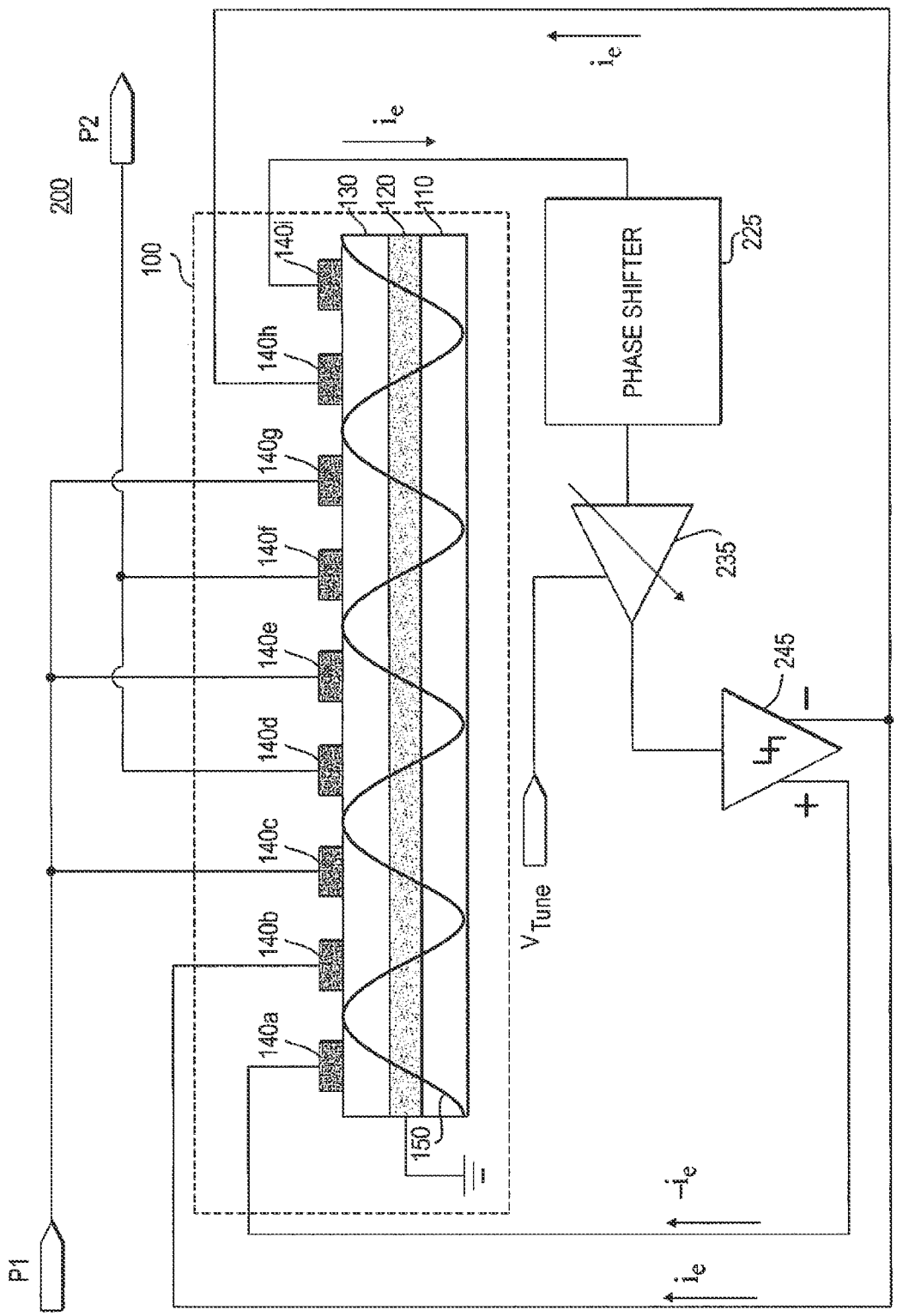
FIG. 2 is a schematic diagram of an apparatus according to an embodiment of the present invention.

FIG. 2 is a schematic diagram of an apparatus according to an embodiment of the present invention. The apparatus 200 includes elements that have been previously described with respect to the resonator 100 of FIG. 1. Those elements have been shown in FIG. 2 using the same reference numbers used in FIG. 1 and operation of the common elements is as previously described. Consequently, a detailed description of the operation of these elements will not be repeated in the interest of brevity.

The apparatus 200 may include a feedback loop having a phase shifter 225, a variable gain amplifier 235 and an amplifier 245. The phase shifter 225 may be coupled to the upper electrode 140i, and configured to receive a feedback signal from the upper electrode 140i during operation. The feedback signal may, for instance, be indicative of the magnitude of current flowing through the resonator in response to an input voltage.

The phase shifter 225 may be configured to phase shift the feedback signal to provide a phase shifted signal. In some examples, the phase shifter 225 may phase shift the feedback signal such that the phase shifted signal is reactive. For example, the phase shifter 225 may phase shift the feedback signal by −90 degrees such that the feedback signal is capacitive or may phase shift the feedback signal by 90 degrees such that the feedback signal is inductive. In some examples, the phase shifter 225 is an integrator.

The variable gain amplifier 235 may be coupled to the phase shifter 225 and configured to receive the phase shifted signal. The variable gain amplifier 235 may further receive a gain signal applied to a node $V_{Tune}$ for the purposes of controlling the amplification of the phase shifted signal. The gain signal may, for instance, be provided by external circuitry and/or may be adjusted in real-time during operation of the apparatus 200. For example, the gain signal may be provided by frequency-selection control logic of a radio (not shown). Based on the gain signal, the variable gain amplifier 235 may amplify the phase shifted signal to provide an amplified signal. For example, the larger the magnitude of the gain signal, the greater the amplification of the phase shifted signal. Because the gain signal may be adjusted in real-time, the amplification of the phase shifted signal may also be adjusted in real-time. Amplifying the phase shifted signal in accordance with the gain signal may allow the center frequency of the resonator 100 to be tuned.

The amplifier 245 may be coupled to the variable gain amplifier 235 and configured to receive the amplified signal, and further may provide a tuning signal based on the amplified signal. In some examples, the amplifier 245 may be a differential amplifier and accordingly the tuning signal may be a differential signal including a first complementary signal (e.g., a positive signal) and a second complementary signal (e.g., a negative signal). The amplifier 245 may further be coupled to the upper electrodes 140a, 140b, and 140h and may provide the positive signal to the upper electrode 140a and may provide the negative signal to the upper electrodes 140b and 140h. In some examples, the amplifier 245 may be a unity gain differential amplifier.

The remaining upper electrodes 140 may be used to either receive an input signal or provide an output signal. For example, as illustrated, the upper electrodes 140c, 140e, and 140g may receive an input signal applied to the node P1 and the upper electrodes 140d and 140f may provide an output signal to the node P2. Accordingly, examples of the present invention provide separate tuning electrodes (e.g. electrodes 140a, 140b, 140h) that may be utilized to tune a center frequency of a resonator. The tuning electrodes may be separate from the electrodes used to receive an input signal, the electrodes used to provide an output signal, or both.

Whereas the apparatus 200 has been represented in FIG. 2 for the purposes of illustration of embodiments directed to a differential tuning signal, in some examples, the tuning signal may be single-ended. In such instances, the amplifier 245 is coupled to the upper electrode 140a, the node P2 is coupled to upper electrodes 140b, 140d, 140f, and 140h, the node P1 is coupled to upper electrodes 140c, 140e, and 140g, and the phase shifter 225 is coupled to electrode 140i.

In operation, an input signal may be applied to the node P1 and received by the upper electrodes 140c, 140e, and 140g. The resonator 100 may begin to operate in response to the input signal and provide an output signal from the upper electrodes 140d and 140f to the node P2. The upper electrode 140h may provide a feedback signal to the phase shifter 225, and the feedback signal may indicate the current flowing through the resonator 100 during operation. The phase shifter 225 may receive the feedback signal and phase shift the feedback signal to provide a phase shifted signal. As described, the phase shift may be −90 degrees.

The variable gain amplifier 235 may receive the phase shifted signal from the phase shifter 225 and the gain signal from the node $V_{Tune}$. Based on the gain signal, the variable gain amplifier 235 may amplify the phase shifted signal to provide an amplified signal. The amplifier 245 may receive the amplified signal from the variable gain amplifier 235 and provide a tuning signal based on the amplified signal. The amplifier 245 may provide the positive signal to the upper electrode 140a and may provide the negative signal to the upper electrodes 140b and 140h. In some examples, the amplifier 245 may further attenuate the positive signal and/or the negative signal in the event that either the positive signal or the negative signal exceed a threshold, e.g., based on a supply voltage level. Application of the tuning signal to the electrodes may act to modulate the stiffness of the resonator, shifting the center frequency.

Varying the gain signal may cause the amplification of the phase shifted signal to vary accordingly, and in this manner, the magnitude of the tuning signal may be adjusted. Because the tuning signal may be a capacitive signal, adjusting the magnitude of the tuning signal will adjust the tuning capacitance provided to the resonator 100. Thus, adjusting the magnitude of the tuning signal will result in tuning the center frequency of the resonator 100. In some examples, the tuning capacitance may be determined in accordance with the following equation:

$$C_{Tune} = \frac{C_{int}}{G_{VGA}},$$

where $C_{Tune}$ corresponds to the tuning capacitance, $G_{VGA}$ corresponds to the gain of the variable gain amplifier 235, and $C_{int}$ corresponds to the magnitude of the capacitance of the phase shifter 225. As can be seen from the aforementioned equation, gain $G_{VGA}$ and tuning capacitance $C_{Tune}$ may be inversely related. Theoretically speaking, an infinite gain $G_{VGA}$ results in tuning capacitance $C_{Tune}$ having a magnitude of zero and a zero gain $G_{VGA}$ results in an infinite tuning capacitance $C_{Tune}$.

Because the magnitude of the tuning signal influences the degree to which the center frequency is tuned, the maximum magnitude of the tuning signal may correspond to a highest possible value for the tuned center frequency. This relationship may be expressed by the following equation:

$$V_{LT} = G_{VGA} \left| \frac{1}{sC_{int}} i_e \right|, \text{ at max } (f_{To}),$$

where $V_{LT}$ corresponds to the maximum magnitude of the tuning signal, $G_{VGA}$ corresponds to the gain of the variable gain amplifier 235, $sC_{int}$ corresponds to the impedance of the phase shifter 225 as modeled in the Laplace domain, $i_e$ corresponds to the magnitude of the current of the feedback signal, and $\max(f_{To})$ corresponds to the maximum tuned center frequency. Similarly, a zero magnitude tuning signal may correspond to the natural frequency of the resonator 100.

The maximum gain may also be determined. Recognizing the relationship $$\left| \frac{1}{sC_{int}} i_e \right| = V_{LR},$$

where $sC_{int}$ corresponds to the impedance of the phase shifter 225 as modeled in the Laplace domain, $i_e$ corresponds to the magnitude of the current of the feedback signal, and $V_{LR}$ corresponds to the maximum input voltage at node P1, the following equation may be used to determine maximum gain:

$$\max(G_{VGA}) = \frac{V_{LT}}{V_{LR}},$$

where $\max(G_{VGA})$ corresponds to the maximum gain of the variable gain amplifier 235, $V_{LT}$ corresponds to the maximum magnitude of the tuning signal, and $V_{LR}$ corresponds to the maximum input voltage at node P1. Knowing maximum gain, the minimum tuning capacitance $C_{Tune}$ may be determined in accordance with the following equation:

$$\min(C_{Tune}) = C_{int} \frac{V_{LT}}{V_{LR}},$$

where $\min(C_{Tune})$ corresponds to the minimum magnitude of the tuning capacitance, $C_{int}$ corresponds to the magnitude of the capacitance of the phase shifter 225, $V_{LT}$ corresponds to the maximum magnitude of the tuning signal, and $V_{LR}$ corresponds to the maximum input voltage at node P1.

As described herein, the center frequency of the resonator 100 of FIG. 2 may be tuned using active components, such as the variable gain amplifier 235. In some examples, actively tuning a center frequency may allow for a greater tuning range than examples directed to passively tuning a center frequency. For example, as described, in passively tuned examples, shunt capacitances between upper electrodes 140 and a lower electrode 120 may limit the range over which a center frequency may be tuned. By instead supplying gain using active components, upper electrodes 140 may be driven such that the effects of shunt capacitances on the tuning capacitance $C_{Tune}$ are reduced or eliminated.

Figure 3:
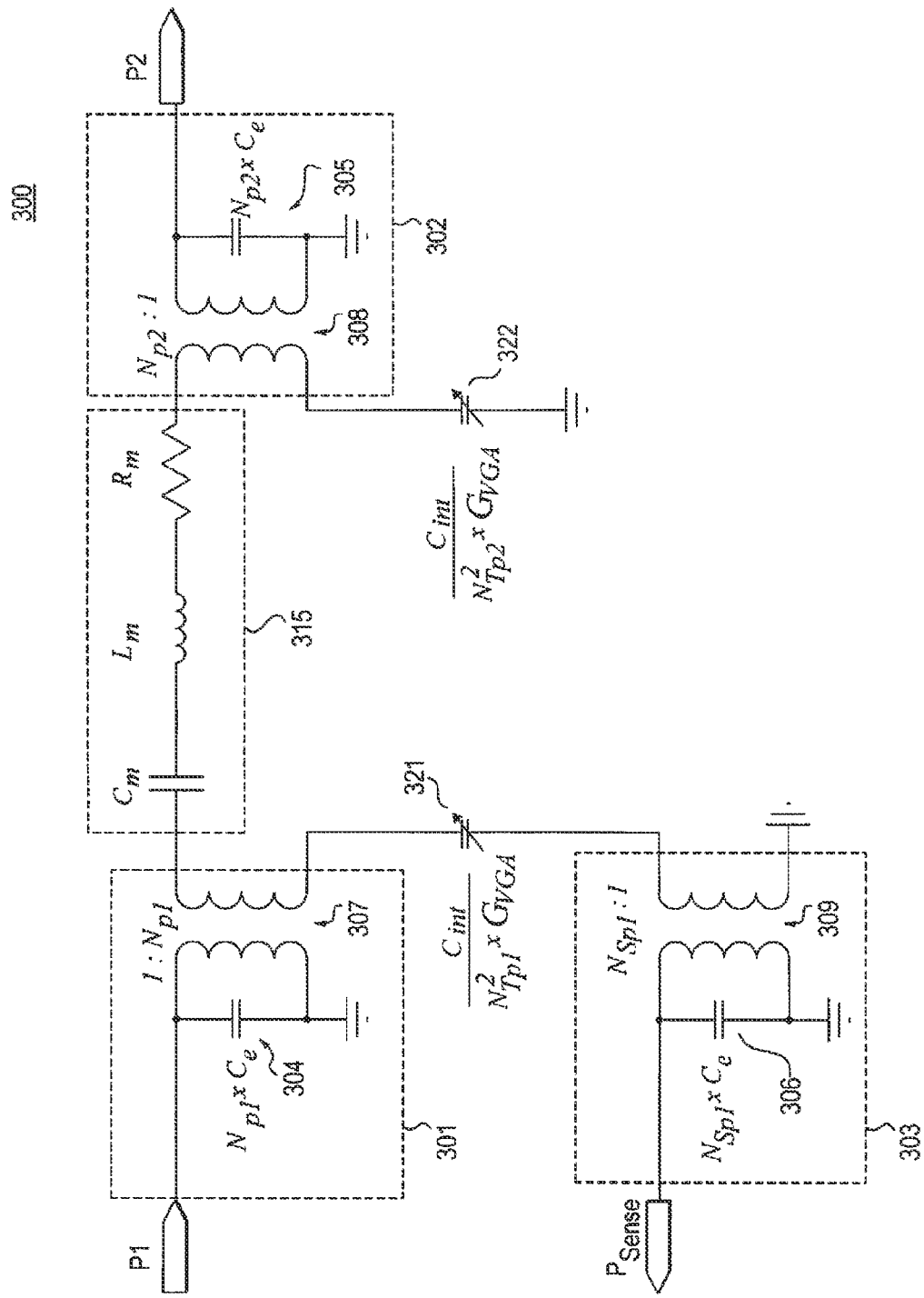
FIG. 3 is a schematic diagram of a circuit equivalent model of the apparatus of FIG. 2 according to an embodiment of the present invention.

FIG. 3 is a schematic diagram of a circuit equivalent model 300 of the apparatus of FIG. 2 according to an embodiment of the present invention. The circuit equivalent model 300 includes models 301, 302, 303, and 315.

The models 301, 302, and 303 are circuit equivalents for one or more upper electrodes 140 associated with respective nodes of the apparatus 200. For example, the model 301 is a circuit equivalent model for one or more upper electrodes 140 receiving an input signal applied to the node P1. A capacitor 304 of the model 301 has a capacitance equal to the number of upper electrodes 140 configured to receive the input signal, or $N_{p1}$, multiplied by the shunt capacitance of each upper electrode 140, or $C_e$. The model 301 further includes a transformer 307. The ratio of turns of the transformer 307 is 1:$N_{p1}$.

Similarly, the model 302 is a circuit equivalent model for one or more upper electrodes 140 providing an output signal to the node P2. A capacitor 305 of the model 302 has a capacitance equal to the number of upper electrodes 140 configured to receive the input signal, or $N_{p2}$, multiplied by the shunt capacitance of each upper electrode 140, or $C_e$. The model 302 further includes a transformer 308. The turns ratio of the transformer 308 is 1:$N_{p2}$.

The model 303 is a circuit equivalent model for one or more upper electrodes 140 providing a feedback signal. A capacitor 306 of the model 303 has a capacitance equal to the number of upper electrodes 140 configured to provide the feedback signal, or $N_{Sp1}$, multiplied by the shunt capacitance of each upper electrode 140, or $C_e$. The model 303 further includes a transformer 309. The turns ratio of the transformer 308 is 1:$NS_{p1}$.

The model 315 is a circuit equivalent model for the motional resistance, inductance, and capacitance of the resonator 100, or $R_m$, $L_m$, and $C_m$, respectively, and as illustrated is coupled between the transformer 307 of the model 301 and the transformer 308 of the model 302.

The circuit equivalent model 300 further includes variable capacitors 321, 322. The magnitude of the capacitance of the variable capacitor 321 may be determined in accordance with the following formula:

$$\frac{C_{int}}{N_{Tp1}^2 \times G_{VGA}},$$

where $C_{int}$ corresponds to the magnitude of the capacitance of the phase shifter 225, $N_{TP1}^2$ corresponds to the number of upper electrodes 140 receiving the positive signal from the amplifier 245, and $G_{VGA}$ corresponds to the gain of the variable gain amplifier 235. The magnitude of the capacitance of the variable capacitor 322 may be determined in accordance with the following formula:

$$\frac{C_{int}}{N_{Tp2}^2 \times G_{VGA}},$$

where $C_{int}$ corresponds to the magnitude of the capacitance of the phase shifter 225, $N_{TP2}^2$ corresponds to the number of upper electrodes 140 receiving the negative signal from the amplifier 245, and $G_{VGA}$ corresponds to the gain of the variable gain amplifier 235.

From the equivalent circuit model 300, equations for determining several parameters associated with the apparatus 200 may be derived. Natural center frequencies may be determined in accordance with the following formula:

$$f_o = \frac{1}{2\pi \sqrt{L_m C_m}},$$

where $f_o$ corresponds to the natural center frequency, $L_m$ corresponds to the motional inductance of the resonator 100, and $C_m$ corresponds to the motional capacitance of the resonator 100.

Moreover, tuned center frequencies of the resonator 100 may be determined in accordance with the following formula:

$$f_{To} = f_o \sqrt{1 + \frac{G_{VGA}(N_{Tp1}^2 + N_{Tp2}^2)C_m}{C_{int}}},$$

where $f_{To}$ corresponds to the tuned center frequency, $f_o$ corresponds to the natural center frequency, $G_{VGA}$ corresponds to the gain of the variable gain amplifier 235, $N_{TP1}^2$ corresponds to the number of upper electrodes 140 receiving the positive signal from the amplifier 245, $N_{TP2}^2$ corresponds to the number of upper electrodes 140 receiving the negative signal from the amplifier 245, $C_m$ corresponds to the motional capacitance of the resonator 100, and $C_{int}$ corresponds to the magnitude of the capacitance of the phase shifter 225.

The minimum and maximum tuned center frequencies may be determined as well, thereby defining a tuning range for a center frequency. A maximum tuned center frequency may be determined in accordance with the following formula:

$$\max(f_{To}) = f_o \sqrt{1 + \frac{V_{LT}}{V_{LR}} \frac{(N_{Tp1}^2 + N_{Tp2}^2)C_m}{C_{int}}},$$

where $\max(f_{To})$ corresponds to the maximum tuned center frequency, $f_o$ corresponds to the natural center frequency, $V_{LR}$ corresponds to the maximum input voltage at node P1, $V_{LT}$ corresponds to the maximum magnitude of the tuning signal, $N_{TP1}^2$ corresponds to the number of upper electrodes 140 receiving the positive signal from the amplifier 245, $N_{TP2}^2$ corresponds to the number of upper electrodes 140 receiving the negative signal from the amplifier 245, $C_m$ corresponds to the motional capacitance of the resonator 100, and $C_{int}$ corresponds to the magnitude of the capacitance of the phase shifter 225.

Similarly, the minimum tuned center frequency may be determined in accordance with the following formula:

$$\min(f_{To}) = f_o \sqrt{1 - \frac{V_{LT}}{V_{LR}} \frac{(N_{Tp1}^2 + N_{Tp2}^2)C_m}{C_{int}}},$$

where $\min(f_{To})$ corresponds to the minimum tuned center frequency, $f_o$ corresponds to the natural center frequency, $V_{LR}$ corresponds to the maximum input voltage at node P1, $V_{LT}$ corresponds to the maximum magnitude of the tuning signal, $N_{TP1}^2$ corresponds to the number of upper electrodes 140 receiving the positive signal from the amplifier 245, $N_{TP2}^2$ corresponds to the number of upper electrodes 140 receiving the negative signal from the amplifier 245, $C_m$ corresponds to the motional capacitance of the resonator 100, and $C_{int}$ corresponds to the magnitude of the capacitance of the phase shifter 225. In some examples, to achieve decreases in center frequency, the polarity of the gain may be inverted.

Figure 4:
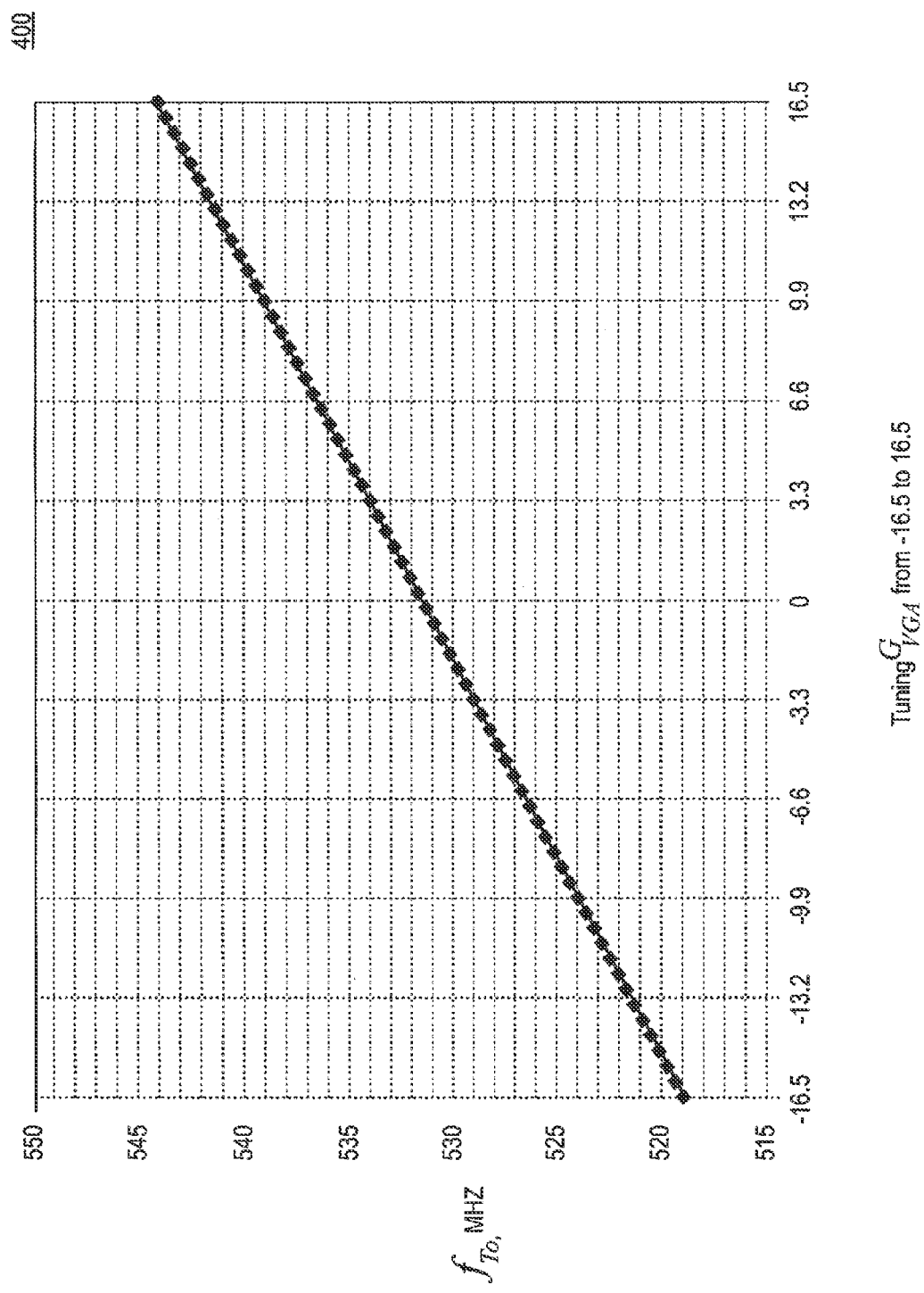
FIG. 4 is a plot illustrating shift in center frequency as a function of gain according to an embodiment of the present invention.

FIG. 4 is a plot 400 illustrating shift in center frequency as a function of gain according to an embodiment of the present invention. The plot 400 may reflect data from a simulation of the apparatus 200 of FIG. 2. As illustrated in FIG. 4, as gain increases approximately from a factor of −16.5 to a factor of 16.5, the center frequency increases approximately from 519 MHz to 544 MHz, an increase of 25 MHz. In some examples, the increase of 25 MHz may reflect a 4.7% increase of the center frequency, an increase in center frequency 10× greater than those achievable using passive tuning.

Figure 5:
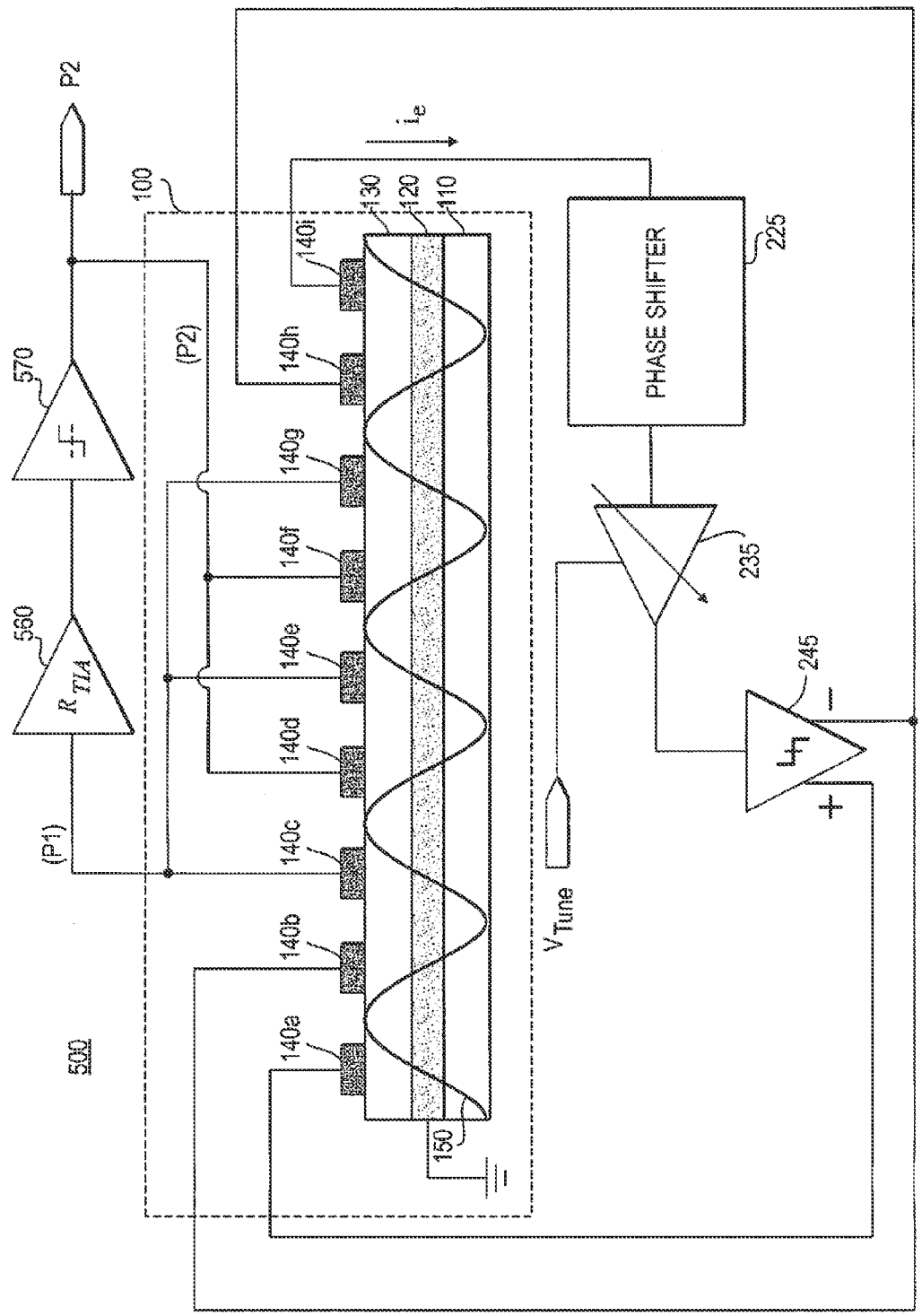
FIG. 5 is a schematic diagram of an apparatus according to an embodiment of the present invention.

FIG. 5 is a schematic diagram of an apparatus 500 according to an embodiment of the present invention. The apparatus 500 includes elements that have been previously described with respect to the apparatus 200 of FIG. 2. Those elements have been shown in FIG. 5 using the same reference numbers used in FIG. 2 and operation of the common elements is as previously described. Consequently, a detailed description of the operation of these elements will not be repeated in the interest of brevity.

The apparatus 500 may include an amplifier 560 and a voltage limiter 570 to form an oscillator by providing positive feedback between the upper electrodes 140c, 140e and 140g and the upper electrodes 140d and 140f. The input of the amplifier 560 may be coupled to the upper electrodes 140c, 140e, and 140g and may be configured to receive an output signal therefrom. In some examples, the amplifier 560 may be a transimpedance amplifier and accordingly may be configured to convert the output signal from a current-based signal to a voltage-based signal to provide a converted signal. In some examples, the amplifier 560 further may amplify the output signal.

The voltage limiter 570 may be configured to receive the converted signal and attenuate the converted signal responsive to the converted signal exceeding a particular voltage magnitude. The voltage limiter 570 may, for instance, limit the magnitude of the converted signal to $V_{LR}$. The voltage limiter 570 may be configured to provide an attenuated signal to the node P2 and further may provide the attenuated signal to the upper electrodes 140d and 140f. In this manner, the amplifier 560 and the voltage limiter 570 may provide a feedback loop between the input and output of the resonator 100. Accordingly, the apparatus 500 may operate as an oscillator and provide an output signal having a frequency based on the gain signal applied to the node $V_{Tune}$. That is, because the gain signal may be adjusted to tune the center frequency of the resonator 100, the frequency of the output signal may also be specified by the gain signal. In this manner, the apparatus 500 may be a voltage-controlled oscillator. In at least one embodiment, the voltage limiter 570 may be included in the amplifier 560.

In some examples, components of apparatuses described herein, such as the apparatus 200 and the apparatus 500, may be integrated in a single chip. In other examples, components of respective apparatuses may be integrated in multiple chips.

Moreover, examples described herein are directed to providing signals to and receiving signals from various upper electrodes 140. For example, with respect to the apparatus 200, input signals applied to the node P1 are provided to the upper electrodes 140c, 140e, and 140g and output signals are provided to the node P2 from the upper electrodes 140d and 140f. It will be appreciated, however, that any number of other configurations of the upper electrodes 140 may be used. That is, any upper electrode 140 may be configured to receive an input signal or tuning signal and/or provide an output signal or feedback signal. For example, in at least one embodiment, the node P1 may be coupled to the upper electrodes 140d and 140f such that the upper electrodes 140d and 140f receive input signals applied to the node P1, and the node P2 may be coupled to the upper electrodes 140c, 140e, and 140g such that the upper electrodes 140c, 140e, and 140g may provide output signals to the node P2. In other examples, a bottom electrode, such as the bottom electrode 120 may be segmented into multiple bottom electrodes such that the bottom electrodes may be used to tune a center frequency.

Apparatuses and methods of tuning described herein may be utilized to compensate for resonator frequency change due to temperature. As a center frequency of the resonator changes due to temperature, the techniques described herein may be used to re-tune the frequency to maintain the center frequency despite a change in temperature. Apparatuses and methods of tuning described herein may compensate for errors in center frequency during manufacturing. When a completed resonator is tested, and the center frequency of the resonator is determined to be different than desired, tuning methods and apparatuses described herein may be utilized to adjust the center frequency to the desired center frequency. Apparatuses and methods described herein including the ability to control center frequency may be used to implement tunable radio frequency (RF) filters, and may be used to implement voltage-controlled oscillators.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for tuning an acoustic wave resonator that includes a plurality of radio-frequency (rf) transducer electrodes, comprising:
    in a feedback loop, receiving a feedback signal from one or more of the rf transducer electrodes;
    phase shifting the received feedback signal to provide a phase shifted feedback signal having a phase shift;
    amplifying the phase-shifted feedback signal to provide a tuning signal; and
    returning the tuning signal to one or more of the rf transducer electrodes; wherein:
    the method further comprises applying a control signal to a variable gain amplifier for actively tuning the acoustic wave resonator;
    the amplification of the phase-shifted feedback signal is performed, at least in part, in the variable gain amplifier in response to the control signal;
    the tuning signal is returned to the one or more said rf transducer electrodes with the said phase shift;
    the plurality of rf transducer elements comprises a feedback group, a tuning group, an input group, and an output group, each said group consisting of one or more rf transducer electrodes unshared with any other said group;
    the feedback signal is received in the feedback loop from the feedback group;
    the tuning signal is returned to the tuning group;
    the method further comprises applying an input signal to an input port connected to the input group; and
    the method further comprises obtaining an output signal from an output port connected to the output group.

2. The method of claim 1, wherein the tuning signal comprises a differential signal including a plurality of complementary signals and wherein returning the tuning signal comprises:
    providing a first complementary signal of the plurality of complementary signals to a first rf transducer electrode of the resonator; and
    providing a second complementary signal of the plurality of complementary signals of the tuning signal to a second rf transducer electrode of the resonator.

3. The method of claim 1, wherein phase shifting the received feedback signal to provide a phase shifted feedback signal comprises phase shifting the received feedback signal by −90 degrees.

4. The method of claim 1, further comprising attenuating the tuning signal responsive to the tuning signal exceeding a threshold.

5. An apparatus having a resonant frequency that is tunable in response to a control signal, comprising:
    an acoustic wave resonator that includes a plurality of radio-frequency (rf) transducer electrodes; and
    a feedback loop configured to receive a feedback signal from one or more of the rf transducer electrodes, process the received feedback signal so as to create a tuning signal, and return the tuning signal to one or more of the rf transducer electrodes; wherein:
    the feedback loop comprises an element for imparting a phase shift to the feedback signal so as to provide a phase-shifted feedback signal;
    the feedback loop further comprises a variable gain amplifier configured to amplify the phase-shifted feedback signal according to a gain controlled by the control signal, thereby to actively tune the resonant frequency;
    the tuning signal is returned to the one or more said rf transducer electrodes with the said phase shift imparted by the phase-shifting element;

the plurality of rf transducer elements comprises an input group, an output group, a feedback group, and a tuning group, each said group consisting of one or more rf transducer electrodes unshared with any other said group;

a signal input port is connected to the input group;

a signal output port is connected to the output group;

the feedback loop receives the feedback signal from the feedback group; and the tuning signal is returned to the tuning group.

6. The apparatus of claim 5, wherein the feedback loop further comprises:

an amplifier coupled to the variable gain amplifier and configured to receive the amplified signal and to provide the tuning signal, the tuning signal based on the amplified signal.

7. The apparatus of claim 6, wherein the phase-shifting element is configured to phase shift the feedback signal such that the feedback signal is reactive.

8. The apparatus of claim 6, wherein the amplifier coupled to the variable gain amplifier comprises a differential amplifier.

9. The apparatus of claim 6, wherein the variable gain amplifier is configured to adjust amplification of the phase shifted feedback signal in real-time.

10. The apparatus of claim 5, wherein the tuning signal comprises a differential signal.

11. The apparatus of claim 5, wherein the resonator is configured to provide a current-based feedback signal, an amplifier coupled to the resonator is configured to convert the feedback signal from a current-based signal to a voltage-based signal; and the apparatus further comprises a voltage limiter coupled to the current-to-voltage-converting amplifier and configured to receive the voltage-based feedback signal, the voltage limiter further configured to attenuate the voltage-based feedback signal responsive to a magnitude of the voltage-based feedback signal exceeding a threshold to provide the tuning signal.

12. An apparatus having a resonant frequency that is tunable in response to a control signal, comprising:

an acoustic wave resonator that includes a plurality of radio-frequency (rf) transducer electrodes; and a feedback loop configured to receive a feedback signal from one or more of the rf transducer electrodes, process the received feedback signal so as to create a tuning signal, and return the tuning signal to one or more of the rf transducer electrodes; wherein:

the feedback loop comprises an element for imparting a phase shift to the feedback signal so as to provide a phase-shifted feedback signal;

the feedback loop further comprises a variable gain amplifier configured to amplify the phase-shifted feedback signal according to a gain controlled by the control signal, thereby to actively tune the resonant frequency;

the tuning signal is returned to the one or more said rf transducer electrodes with the said phase shift imparted by the phase-shifting element;

the plurality of rf transducer elements comprises an output group, an internal feedback group, an external feedback group, and a tuning group, each said group consisting of one or more rf transducer electrodes unshared with any other said group;

the output group is connected to an input of a transimpedance amplifier;

an output of the transimpedance amplifier is connected to an output port;

the output of the transimpedance amplifier is connected to the internal feedback group;

the feedback loop receives the feedback signal from the external feedback group; and the tuning signal is returned to the tuning group.

13. The apparatus of claim 12, further comprising a voltage limiter connected between the output of the transimpedance amplifier and the output port and configured to attenuate signals exiting the output of the transimpedance amplifier responsive to a magnitude of the voltage-based feedback signal exceeding a threshold to provide the tuning signal.

* * * * *